US008682015B2

(12) United States Patent
Miller

(10) Patent No.: US 8,682,015 B2
(45) Date of Patent: Mar. 25, 2014

(54) RF SHIELDING FOR ACOUSTIC DEVICES

(75) Inventor: Thomas E. Miller, Arlington Heights, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 13/606,173

(22) Filed: Sep. 7, 2012

(65) Prior Publication Data
US 2013/0064406 A1 Mar. 14, 2013

Related U.S. Application Data

(60) Provisional application No. 61/532,619, filed on Sep. 9, 2011.

(51) Int. Cl.
*H04R 25/00* (2006.01)
*H05K 9/00* (2006.01)

(52) U.S. Cl.
CPC .............. *H04R 25/00* (2013.01); *H05K 9/00* (2013.01); *H04R 2209/022* (2013.01); *H04R 2225/49* (2013.01)
USPC .......................................... 381/322; 381/189

(58) Field of Classification Search
USPC ......... 381/312, 322, 324, 327, 328, 380, 355, 381/369, 189; 181/158; 361/816–818; 455/575.5, 300, 301; 335/213, 214, 335/301
See application file for complete search history.

(56) References Cited

U.S. PATENT DOCUMENTS

| 4,956,868 | A   | * | 9/1990  | Carlson ......................... 381/189 |
| 7,003,127 | B1  | * | 2/2006  | Sjursen et al. ................ 381/322 |
| 7,181,035 | B2  | * | 2/2007  | van Halteren et al. ........ 381/322 |
| 7,460,681 | B2  |   | 12/2008 | Geschiere et al. |
| 2008/0226108 | A1 | * | 9/2008 | Heerlein et al. .............. 381/324 |

FOREIGN PATENT DOCUMENTS

| EP | 0252764 A2 | 1/1988 |
| EP | 0747732 A2 | 12/1996 |
| WO | 9935969 A1 | 7/1999 |
| WO | 0019242 A2 | 4/2000 |

OTHER PUBLICATIONS

International Search Report for International Patent Application No. PCT/US2012/054169, dated Oct. 30, 2012.
"Alloy Data Carpenter High Permeability "49"® Alloy", Alloy Data Product Datasheet, May 27, 2003.

* cited by examiner

*Primary Examiner* — Tuan D Nguyen
(74) *Attorney, Agent, or Firm* — Fitch, Even, Tabin & Flannery LLP

(57) ABSTRACT

A receiver includes a housing and a sleeve. The housing forms a chamber, and the coil is disposed in the chamber and radiates a flux. The sleeve at least partially surrounds the coil such that a majority of flux radiated from the coil is blocked by the sleeve. The sleeve is constructed of a highly conductive material and is insulated from the housing.

22 Claims, 6 Drawing Sheets

| Material | Resistivity | Permeability | Skin depth (μm) | Skin depth (in) |
|---|---|---|---|---|
| silver | 1.6 | 1 | 36.8 | 0.00145 |
| copper | 1.7 | 1 | 37.9 | 0.00149 |
| gold | 2.2 | 1 | 43.1 | 0.00170 |
| aluminum | 2.9 | 1 | 49.5 | 0.00195 |
| 50% iron/nickle | 58 | 500 | 9.9 | 0.00039 |

Skin depth, select materials

Fig 3

RF SHIELDING FOR ACOUSTIC DEVICES

CROSS REFERENCE TO RELATED APPLICATIONS

This patent claims benefit under 35 U.S.C. §119 (e) to U.S. Provisional Application No. 61/532,619 entitled "RF Shielding For Acoustic Devices" filed Sep. 9, 2011, the content of which is incorporated herein by reference in its entirety.

TECHNICAL FIELD

This application relates to acoustic devices and, more specifically, to shielding these devices to prevent electromagnetic interference with other signals.

BACKGROUND OF THE INVENTION

Various types of microphones and receivers have been used through the years. In these devices, different electrical components are housed together within a housing or assembly. Other types of acoustic devices may include other types of components. These devices may be used in hearing instruments such as hearing aids or in other electronic devices such as cellular phones and computers.

The receiver motor typically includes a coil, a yoke, an armature, and magnets. An electrical signal applied to the coil creates a magnetic field within the motor which causes the armature to move. The armature and reed form a magnetic circuit. While this magnetic circuit is effective at keeping most of the magnetic field within the motor, some portion of this field will leak out of the assembly, and is radiated into the space around it. At radio frequencies, eddy currents prevent the magnetic field from traveling through the magnetic circuit, increasing the radiated field. At these frequencies, the radiation pattern is solely due to the coil.

Hearing instruments typically use a high frequency Pulse Width Modulated (PWM) or Pulse Density Modulation (PDM) signal to power the receivers. These switched signals allow a digital signal processor (DSP) to directly drive the receiver, avoiding the complexity and power inefficiency of performing a digital to analog conversion of the signal before powering the receiver using a traditional analog amplifier. For high efficiency, these systems often use a high carrier frequency, for instance, from 0.2 to 2 MHz. The frequency range just above the carrier frequency of the switching amplifier is a preferred frequency range for radio communications, with the data signal carrier frequency placed at a non-integer multiple of the audio signal carrier to minimize interference.

Many hearing instruments transmit data to other hearing instruments. Unfortunately, the modulation products of the audio signal contain significant energy for another decade above the carrier frequency, overlapping the frequency range of the data signal to be transmitted. In other words, the receiver radiates radio frequency (RF) energy and this interferes with the reception of the transmitted data signals. This, in turn, limits the transmission range of the data signal, and/or requires a higher power signal for transmission. Although higher powered signals can be used, these higher-powered signals create a higher drain on the battery of the acoustic device.

The receiver housing typically is in two pieces, a cup and a cover. The receiver housing is typically made of material such as mu metal which forms a shield to help prevent the magnetic field from escaping. However, the effectiveness of mu metal decreases with frequency. The effectiveness of the shielding at radio frequencies would be improved if a highly conductive material, (e.g. silver, gold, copper, aluminum) were used instead. These highly conductive materials encourage the flow of eddy currents, which will form a magnetic field that is equal and opposite to the field radiated by the receiver motor, hence preventing the field from leaking from the motor. However, these materials have problems such as increased cost, lack of strength, or the shielding of audio frequencies.

BRIEF DESCRIPTION OF THE DRAWINGS

For a more complete understanding of the disclosure, reference should be made to the following detailed description and accompanying drawings wherein:

FIG. 3 is a table showing Skin depth, select materials.

Figure 1A:
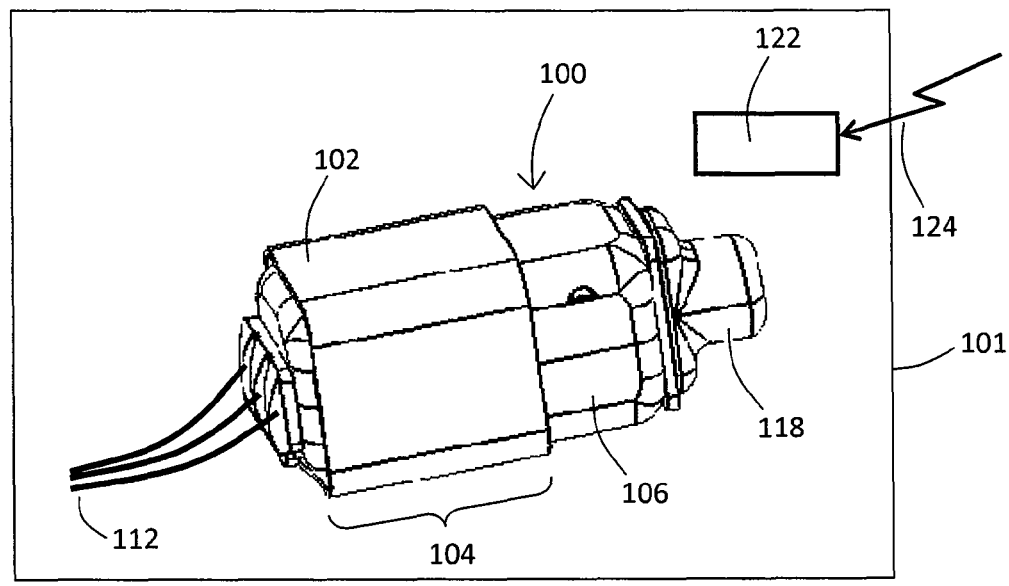
FIG. 1A is a perspective drawing of a receiver with RF shielding according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

In acoustic devices where both audio and data signals are present, RF shielding is provided around all or parts of the receiver housing so that interference caused by RF energy created by the receiver and transmitted signals is substantially reduced or eliminated. Put another way, RF leakage from the receiver is substantially reduced or eliminated thereby reducing and/or eliminating interference with data signals that are being transmitted. The approaches described herein are easy to use and implement, and allow hearing instruments (or other types of devices) to be used without substantial interference with transmitted data signals.

Instead of making the entire housing out of highly conductive material, in some aspects it is sufficient to add a thin band of highly conductive material outside the receiver housing. The eddy current flowing through this band will cancel the radiated field. In many of these embodiments, the band does not need to cover the entire length of the receiver. If the band is placed so that the majority of the flux radiated from the motor passes through the band, then this flux will be blocked by the conductive ring, greatly reducing the radiated field. These approaches provide improved RF shielding, while adding very little to the size and cost of the receiver.

In many of these embodiments, a receiver includes a housing and a sleeve. The housing forms a chamber, and the coil is disposed in the chamber and radiates a flux. The sleeve at least partially surrounds the coil such that a majority of flux radiated from the coil is blocked by the sleeve. The sleeve is constructed of a highly conductive material and is insulated from the housing In other aspects, the sleeve is separate from the housing and surrounds the housing. In other examples, the sleeve includes a lining and is disposed in the cavity and within the housing.

In still other aspects, the sleeve is constructed of a material such as aluminum and copper. Other examples are possible. In still other aspects, the sleeve is a wound wire. In other examples, the sleeve is constructed of at least one panel. In still other aspects, the sleeve is a tube. In yet other aspects, the sleeve includes at least one opening. In other examples, the sleeve is coated with a protective coating to prevent corrosion. It yet other aspects, the housing includes a terminal end and the terminal end has at least one wire coupled thereto. The sleeve extends beyond the terminal end. In still other aspects, the receiver may be disposed within a hearing instrument or other electronic device. The sleeve reduces or eliminates interference with other signals that is caused by the coil.

Figure 1B:
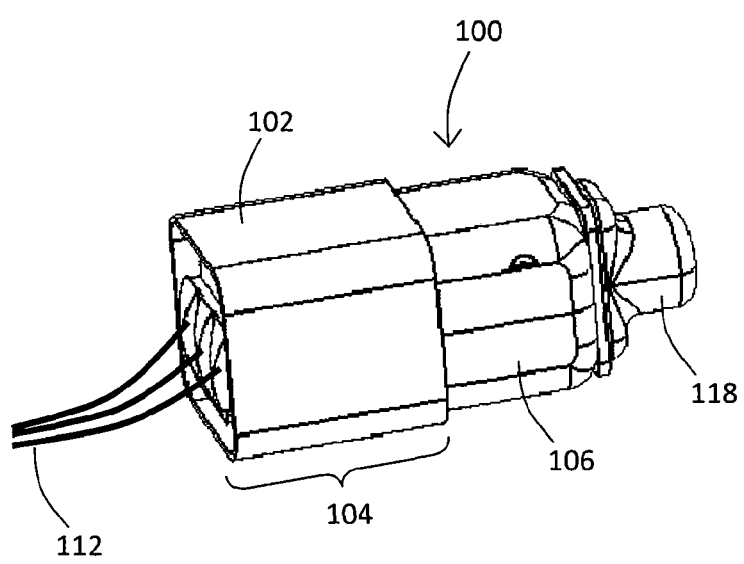
FIG. 1B is a perspective drawing of a receiver with RF shielding with the sleeve moved to cover the coil area and terminals according to various embodiments of the present invention.
Figure 1C:
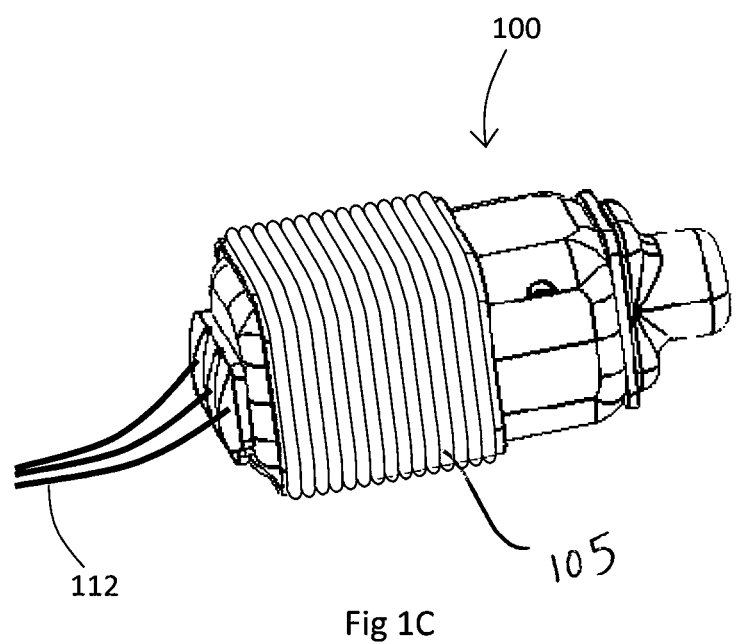
FIG. 1C is a perspective drawing of a receiver with RF shielding with a coil in place of a sleeve according to various embodiments of the present invention.
Figure 1D:
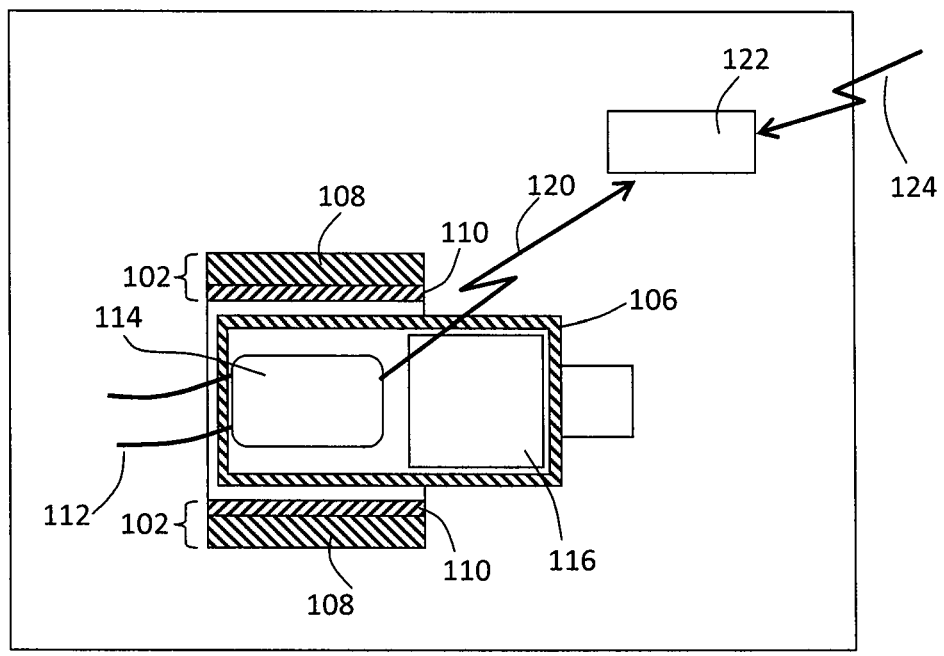
FIG. 1D is a side cutaway view of the receiver of FIG. 1A according to various embodiments of the present invention.

Referring now to FIG. 1A and FIG. 1D, one example of a receiver 100 used in a hearing instrument 101 is described. The receiver 100 includes a sleeve 102 that surrounds a portion 104 of the receiver housing 106. The sleeve 102 includes a first portion 108 and a second portion 110. The first portion 108 may be a highly conductive metal and the second portion 110 may be an insulator. Wires 112 couple the receiver 100 to other electronic devices. The receiver includes a coil 114 within the portion 104 and other electrical components (e.g., a diaphragm or reed to mention a few examples). The other components may be in the portion 104 and/or the remaining portion of the receiver. A sound tube 118 communicates sound energy from the receiver 100 to a user. The receiver receives electrical signals from the wires 112, and converts these signals into sound energy that exits the receiver 100 via the sound tube 118. It will be understood that the receiver creates RF energy 120 that radiates outwardly from the receiver.

The receiver 100 is part of the hearing instrument 101. The hearing instrument 101 includes an antenna 122 that is used to receive RF transmissions 124 from other hearing instruments, in one example. When the sleeve is not used, it will be appreciated that the RF energy 120 leaks out and causes substantial interference with the transmissions 124. However, when the sleeve 102 is used, the amount of leakage is substantially reduced (or eliminated) thereby reducing or eliminating interference with transmitted signals. In one example, approximately 90 percent of the RF energy is prevented from leaking out. Other examples are possible.

The sleeve 102 is constructed of any suitable material such as copper or aluminum. Other materials may also be used. Whatever material is used, this material is a highly conductive material having a resistivity below a certain level. The thickness of the material must be sufficient to provide very low resistance. This is best achieved by using materials with very low resistivity, such as silver, gold, copper, or aluminum. These all have a resistivity of less than approximately 3 micro Ohm-cm.

The useful thickness of the shield material is selected at least in part based upon the skin effect. The current density of an alternating electrical current decreases exponentially with the depth. This is due to eddy currents that are induced by the current flow. The field from these eddy currents acts to hinder current flow. In the case of shielding, these are eddy currents, responding to the RF field radiated by the receiver. Thus, only a thin layer of shielding material is needed, and that further increases in the thickness do not generally improve shielding. The skin depth SD is the depth below the surface where the current decays to 1/e, or 37% that at the surface, and is calculated using:

$$SD = \text{square root}(2\rho/\omega\mu)$$

Where $\rho$ is the resistivity of the conductor, $\omega$ is the angular frequency of the magnetic energy, and $\mu$ is the magnetic permeability of the conductor.

The skin depth of some example shield materials for the sleeve 102 is shown in TABLE 1. The effectiveness of a shield will increase until the material is double the thickness listed in TABLE 1. Due to the skin effect, the thickness of the RF shield in some aspects is approximately 0.002" to 0.005" thick. Other examples of thicknesses are possible.

In the present example, the sleeve 102 is a four-sided hollow structure. In another example, the sleeve 102 may be shaped as a tube. Other examples of shapes for sleeves are possible. The sleeve 102 may be centered over the coil 114 in that it surrounds the coil 114. As used herein "surrounds" meanings that the shield envelops at least one dimension (e.g., the length) of the coil 114. As shown here, the shield 102 envelops the length L of the coil 114. In other words, the coil 114 does not extend beyond the length L of the shield 102. In one aspect, other internal components 116 of the receiver may be covered by the sleeve 102. It will be appreciated that enveloping or at least partially surrounding the coil 114 significantly reduces the amount of RF leakage thereby reducing the amount of interference with the signal 124. It will be appreciated that the coil signal 120 is shielded in one aspect to prevent interference with the radio signal 124.

In one aspect, the tube extends 0.020" (or more) beyond the terminal end of the receiver. The long sleeve has a length approximately equal to the receiver length. A sleeve 102 with half this length is less effective, but still offers significant shielding. Again, advantageous performance in one example is achieved if the sleeve 102 overhangs the terminal area. Another alternative to extending the sleeve 102 past the end of the receiver is to add a strap across terminal area, effectively capping the sleeve 102. This approximately doubles the shield effectiveness for the short sleeve. Generally speaking, the longer the sleeve, the more lines of magnetic flux that will cut through it.

The open sleeve is in some examples easier to use than a box-shaped shield, as it can be installed prior to attaching wires to the receiver. This feature in one example means that the sleeve can be installed on the receiver prior to shipping to the customer.

Increasing the sleeve overhang past the terminals of wires 112 will increase the shielding effectiveness, but adds to the receiver size. In some aspects, the overhang should not extend past the solder bumps to avoid fit problems within the hearing instrument. Overhang is more effective when long sleeve shields are used, and has a much smaller effect when a short sleeve is used.

In some aspects, the sleeve 102 is coated with a protective coating to prevent corrosion. A polymer coating will both reduce corrosion, and insulate the sleeve from the case (housing) of the receiver, which is needed for best shielding. Otherwise, skin effects will prevent the external shield 102 from acting purely as an added shield. In another example, an aluminum sleeve offers nearly as good protection, and avoids corrosion issues (i.e., the sleeve has only a single layer—the aluminum). The sleeve 102 can be insulated from the receiver housing either by pre-coating it with a polymer film (which becomes the layer 104), or by anodizing the inside surface of the foil (e.g., becoming the second portion 104) to mention two examples. When aluminum foil is used for the sleeve 102 (and the layer 104 is omitted), the aluminum foil can be welded into a tube-shaped form, for example, using a Tungsten Inert Gas (TIG) welder.

In another example, the shield 102 is disposed internally to the housing as a lining (e.g., of copper). In this respect, the copper lining of the cup and cover are joined in a way that promotes high conductivity.

High conductivity and high permeability shields have been shown to reduce RF leakage to acceptable levels. Aluminum and copper are preferred materials. When copper is used as the material for the shield, protection against corrosion may also be used (e.g., in the form of a separate anti-corrosive layer). Other examples of construction materials are possible. In one example, a shield over the case allows transmission distances of 35 cm through air (from 27 cm when a shield was not used). Other examples of distances are possible.

In yet other aspects, the sleeve can be a solid sheet of metal, a layer of non-insulated wire wound over the coil, a sheet of metal with an insulator (as shown in FIG. 1A and FIG. 1B) or some other configuration.

Referring now to FIG. 1B, the sleeve 104 is shown extending over the terminal area for the wires 112. The other components of FIG. 1B are the same as FIG. 1A and FIG. 1D and will not be discussed further herein.

Referring now to FIG. 1C, the sleeve 104 is replaced with a wire 105. The other components of FIG. 1C are the same as FIG. 1A and FIG. 1D and will not be discussed further herein.

Figure 2A:
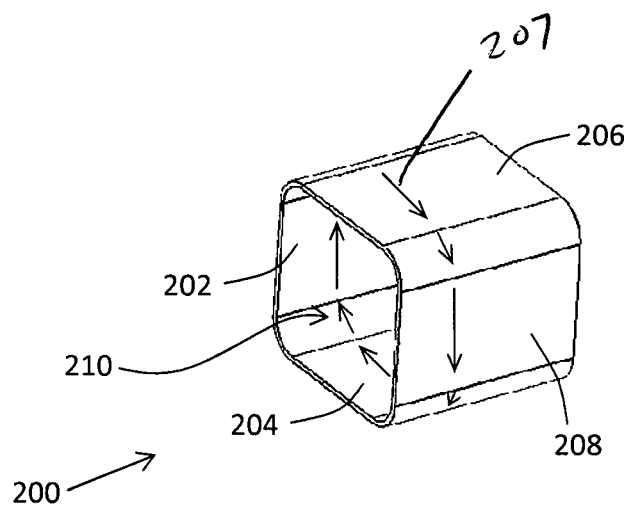
FIG. 2A is a perspective view of an RF shield for use with a receiver according to various embodiments of the present invention.

Referring now to FIG. 2A, one example of a sleeve or shield is described. In this example the shield 200 includes four side panels 202, 204, 206, and 208. These panels form a structure with a hollow space 210 into which all or portions of a receiver are placed. Eddy currents 207 help form the shielding effect.

Figure 2B:
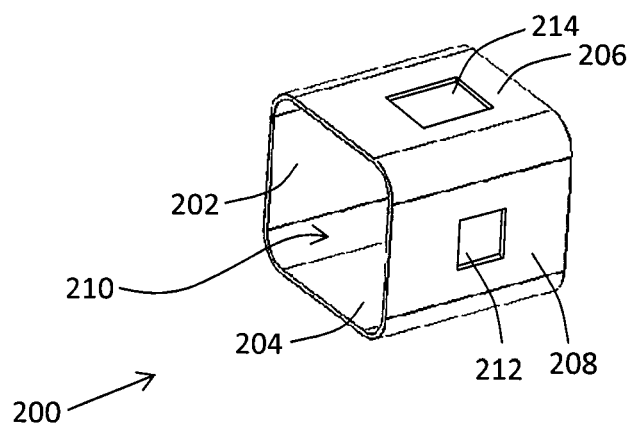
FIG. 2B is a perspective view of an RF shield for use with a receiver according to various embodiments of the present invention.

Referring now to FIG. 2B, another example of a sleeve or shield is described. In this example the shield 200 includes four side panels 202, 204, 206, and 208. These panels form a structure with a hollow space 210 into which all or portions of a receiver are placed. In this example, openings 212 and 214 extend through the panels. In one aspect, one or more openings may be added to the sleeve as long as they do not significantly increase the resistance of a current circulating around the sleeve.

Figure 2C:
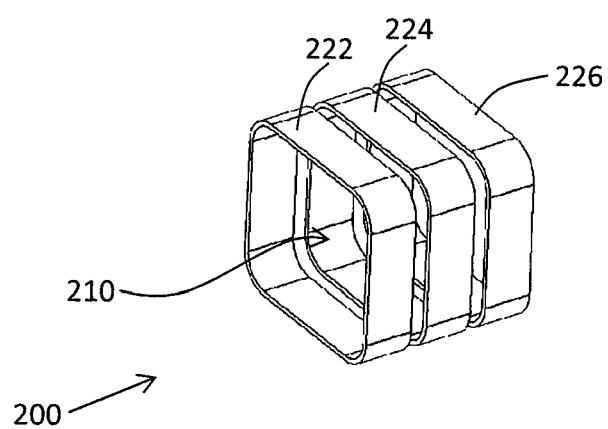
FIG. 2C is a perspective view of an RF shield for use with a receiver according to various embodiments of the present invention.

Referring now to FIG. 2C, yet another example of a sleeve or shield is described. In this example the shield 200 includes three panels 222, 224, and 226 and these are arranged side-to-side. These panels form a structure with a hollow space 210 into which all or portions of a receiver are placed. It will be appreciated that a large number of rings will act to function as the coil shown in FIG. 1C.

It will be appreciated that the shields of FIGS. 2A-2C are examples only and that other shapes, dimensions, and configurations are possible.

It will be appreciated that varying the dimensions, shapes, and/or overhangs of a shield produces varying levels of attenuation. For example, a short sleeve (covering the coil but only approximately 50% of the receiver housing length) produces approximately 15 db of attenuation. While more shielding can potentially be achieved with a longer sleeve, this shorter sleeve provided sufficient protection against interference. In one example, the transmission distance of an antenna is reduced by only approximately 1 percent using the shields described herein as opposed to approximately 22 percent without using the shield.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A receiver, the receiver comprising:
a housing, the housing forming a chamber, wherein a coil is disposed in the chamber and wherein the coil radiates a flux;
a sleeve at least partially surrounding the coil such that a majority of flux radiated from the coil is blocked by the sleeve, wherein the sleeve is constructed of a highly conductive material and is insulated from the housing.

2. The receiver of claim 1 wherein the receiver further comprises at least one of an armature, a magnet, or a reed.

3. The receiver of claim 1 wherein the sleeve is separate from the housing and surrounds the housing.

4. The receiver of claim 1 wherein the sleeve comprises a lining and is disposed in the cavity and within the housing.

5. The receiver of claim 1 wherein the sleeve is constructed of a material selected from the group consisting of aluminum and copper.

6. The receiver of claim 1 wherein the sleeve comprises a wound wire.

7. The receiver of claim 1 wherein the sleeve comprises at least one panel.

8. The receiver of claim 1 wherein the sleeve comprises a tube.

9. The receiver of claim 1 wherein the sleeve comprises at least one opening.

10. The receiver of claim 1 wherein the sleeve is coated with a protective coating to prevent corrosion.

11. The receiver of claim 1 wherein the housing includes a terminal end and the terminal end has at least one wire coupled thereto, and wherein the sleeve extends beyond the terminal end.

12. A hearing instrument, the hearing instrument comprising:
an antenna for receiving wireless signals;
a receiver, the receiver comprising,
a housing, the housing forming a chamber, wherein a coil is disposed in the chamber and wherein the coil radiates a flux;
a sleeve at least partially surrounding the coil such that a majority of flux radiated from the coil is blocked or by the sleeve to prevent interference with the wireless signal wherein the sleeve is constructed of a highly conductive material and is insulated from the housing.

13. The hearing instrument of claim 12 wherein the receiver further comprises at least one of an armature, a magnet, or a reed.

14. The hearing instrument of claim 12 wherein the sleeve of the receiver is separate from the housing and surrounds the housing.

15. The hearing instrument of claim 12 wherein the sleeve of the receiver comprises a lining and is disposed in the cavity and internal to the housing.

16. The hearing instrument of claim 12 wherein the sleeve of the receiver is constructed of a material selected from the group consisting of aluminum and copper.

17. The hearing instrument of claim 12 wherein the sleeve of the receiver comprises a wound wire.

18. The hearing instrument of claim 12 wherein the sleeve of the receiver comprises at least one panel.

19. The hearing instrument of claim 12 wherein the sleeve of the receiver comprises a tube.

20. The hearing instrument of claim 12 wherein the sleeve of the receiver comprises at least one opening.

21. The hearing instrument of claim 12 wherein the sleeve of the receiver is coated with a protective coating to prevent corrosion.

22. The hearing instrument of claim 12 wherein the housing of the receiver includes a terminal end and the terminal end has at least one wire coupled thereto, and wherein the sleeve extends beyond the terminal end.

\* \* \* \* \*